(12) United States Patent
Heineke et al.

(10) Patent No.: US 6,574,091 B2
(45) Date of Patent: Jun. 3, 2003

(54) MULTI-PLATE CAPACITOR STRUCTURE

(75) Inventors: Randolph B. Heineke, Rochester, MN (US); Scott Allen Olson, Rochester, MN (US); David John Orser, Farmington, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/218,789

(22) Filed: Aug. 14, 2002

(65) Prior Publication Data

US 2003/0034844 A1 Feb. 20, 2003

Related U.S. Application Data

(62) Division of application No. 09/810,133, filed on Mar. 16, 2001, now Pat. No. 6,489,850.

(51) Int. Cl.[7] .................................................. H01G 4/38
(52) U.S. Cl. ........................ 361/328; 361/303; 361/311; 361/329; 257/296; 257/309
(58) Field of Search ................................ 361/303, 311, 361/328, 329; 257/296, 309

(56) References Cited

U.S. PATENT DOCUMENTS

| | | | |
|---|---|---|---|
| 4,079,333 A | | 3/1978 | Yamada .................. 330/124 R |
| 4,573,101 A | * | 2/1986 | Takeno ....................... 361/321 |
| 4,697,159 A | * | 9/1987 | Sechi et al. .................. 361/278 |
| 4,881,149 A | * | 11/1989 | Tokura et al. ............... 361/328 |
| 4,935,657 A | * | 6/1990 | Lherm et al. ................ 361/329 |
| 5,012,385 A | * | 4/1991 | Kurabayashi et al. ........ 361/328 |
| 5,204,546 A | * | 4/1993 | Moulding .................... 361/329 |
| 5,422,782 A | * | 6/1995 | Hernandez et al. ......... 361/329 |
| 6,075,995 A | | 6/2000 | Jensen ......................... 455/550 |
| 6,285,542 B1 | * | 9/2001 | Kennedy, III et al. ...... 361/328 |
| 6,489,850 B2 | * | 12/2002 | Heineke et al. ............. 330/307 |
| 2002/0134581 A1 | * | 9/2002 | Figueroa et al. ............ 361/328 |

FOREIGN PATENT DOCUMENTS

| | | | |
|---|---|---|---|
| JP | 6213109 | | 1/1987 |
| JP | 6472519 | * | 3/1989 |
| JP | 2203513 | * | 8/1990 |

OTHER PUBLICATIONS

Nishiyama et al. "Capacitance of Disk Capacitors" IEEE Transactions on Components, Hybrids and Manufacturing Technology, Part A, B, C, vol. 16, Issue 3 May 1993*

* cited by examiner

Primary Examiner—Michael B Shingleton
(74) Attorney, Agent, or Firm—Dugan & Dugan, PC

(57) ABSTRACT

A multichannel parallel IC amplifier includes a plurality of amplifier circuits formed on an IC substrate. Each amplifier circuit is coupled to respective inputs via a pair of capacitors. The capacitors are configured so as to substantially equalize like sense and unlike sense coupling between adjacent channels, leading to cancellation of crosstalk signals.

5 Claims, 4 Drawing Sheets

MULTI-PLATE CAPACITOR STRUCTURE

This application is a division of U.S. patent application Ser. No. 09/810,133, filed Mar. 16, 2001, now U.S. Pat. No. 6,489,850, which is hereby incorporated by reference herein in its entirety.

FIELD OF THE INVENTION

This invention is concerned with integrated circuits (ICs) and is more particularly concerned with multichannel IC amplifiers.

BACKGROUND OF THE INVENTION

FIG. 1 is a schematic plan view of a conventional four-channel IC amplifier 10. The multichannel amplifier 10 includes four separate amplifier circuits 12, each corresponding to a respective channel. A pair of input terminals 14 and a pair of output terminals 16 are provided for each channel. Each amplifier circuit 12 is coupled to its respective input terminals 14 via a pair of DC-blocking capacitors 18. A positive-sense capacitor 18a and a negative-sense capacitor 18b are provided for each amplifier circuit 12.

A problem that arises with the conventional multichannel amplifier arrangement as shown in FIG. 1 is crosstalk between adjacent channels resulting from parasitic capacitive coupling between the negative-sense capacitor for one channel with the positive-sense capacitor for an adjacent channel. Even with very low parasitic values, crosstalk can arise because of the high frequency data transmission rates currently employed (e.g., about 1 GHz or greater). Crosstalk can also result from deep substrate coupling.

Isolation of channels is a technique that has been used to reduce crosstalk. For example, deep trench isolation has been used, but is not available in all IC fabrication processes. Isolation by spacing channels from one another can also be used but is not space efficient. Power supply traces can be used to shield the capacitors from each other, thereby reducing edge to edge coupling. However, enough deep substrate coupling may remain in this case to cause significant crosstalk.

It accordingly would be desirable to provide a crosstalk-reduction technique that does not suffer from the disadvantages of known techniques.

SUMMARY OF THE INVENTION

According to an aspect of the invention, a multichannel IC amplifier includes a plurality of amplifier circuits formed on an IC substrate. Each amplifier circuit is coupled to respective inputs via a pair of capacitors, and the capacitors are configured so as to substantially equalize like sense and unlike sense coupling between adjacent channels. "Like sense coupling" will be understood to mean positive sense capacitor to positive sense capacitor coupling and negative sense capacitor to negative sense capacitor coupling. "Unlike sense coupling" will be understood to mean negative sense capacitor to positive sense capacitor coupling and positive sense capacitor to negative sense capacitor coupling.

According to another aspect of the invention, a method of suppressing crosstalk between adjacent channels in a multichannel IC amplifier includes coupling substantially equal crosstalk signals to each capacitor of a pair of capacitors for a given channel. The coupled crosstalk signals may then be rejected as common mode signals at the differential amplifier for the given channel.

According to still another aspect of the invention, there is provided a coplanar arrangement for capacitor plates. Each of the four plates corresponds to a respective DC-blocking capacitor. The four plates respectively correspond to a left-channel positive-sense capacitor, a left-channel negative-sense capacitor, a right-channel positive-sense capacitor and a right-channel negative-sense capacitor. The plate corresponding to the left-channel positive-sense capacitor and the plate corresponding to the right-channel positive-sense capacitor define therebetween a first shared edge region having a unit length U. The plate corresponding to the left-channel negative-sense capacitor and the plate corresponding to the right-channel positive-sense capacitor define therebetween a second shared edge region having a length of two times the unit length, i.e. 2U. The plate corresponding to the left-channel negative-sense capacitor and the plate corresponding to the right-channel negative-sense capacitor define therebetween a third shared edge region having the unit length U.

The present invention employs cancellation of cross-coupled signals to reduce or prevent crosstalk, so that isolation and/or shielding between channels may not be necessary. It is, however, also contemplated to use the cancellation arrangement of the present invention together with isolation and/or shielding.

Other objects, features and advantages of the present invention will become more fully apparent from the following detailed description of the preferred embodiments, the appended claims and the accompanying drawings.

DETAILED DESCRIPTION OF PREFERRED EMBODIMENTS

Figure 1:
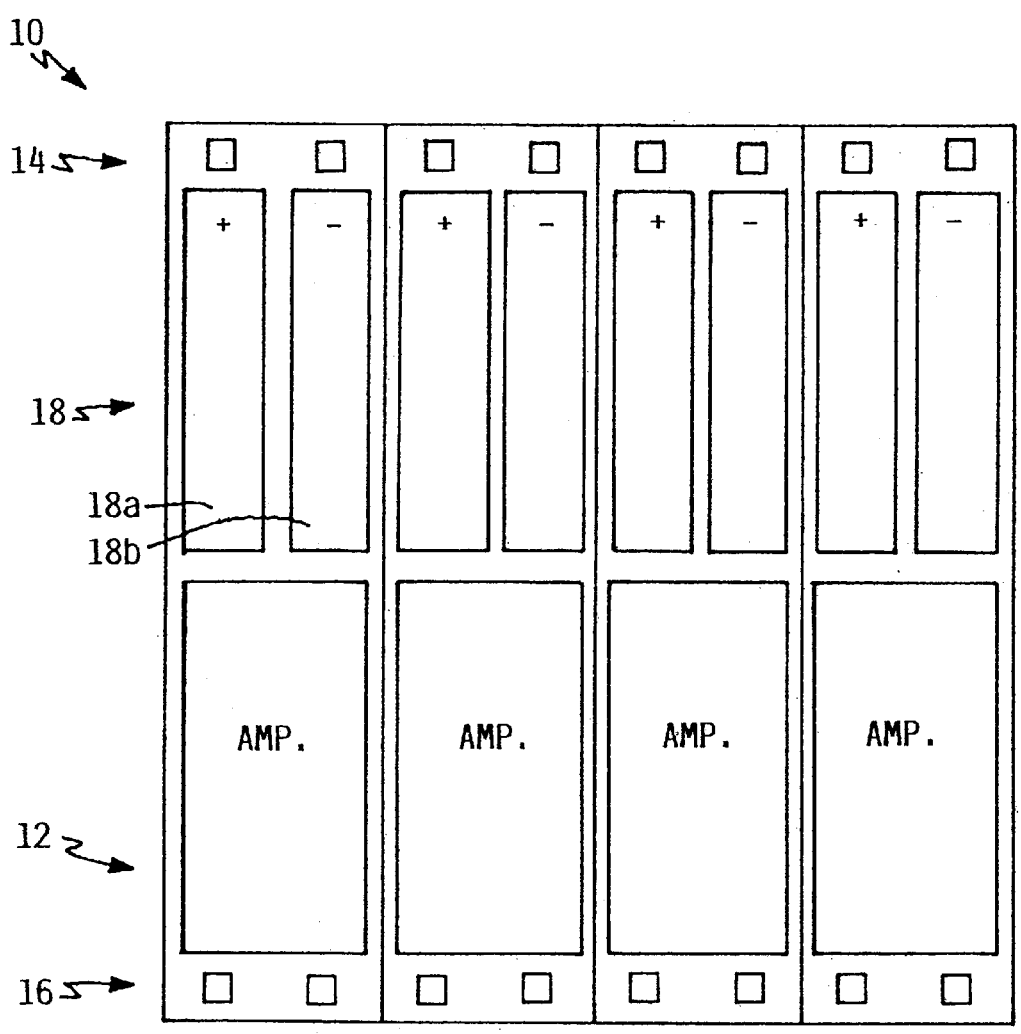
FIG. 1 is a schematic plan view of a conventional multichannel IC amplifier.
Figure 2:
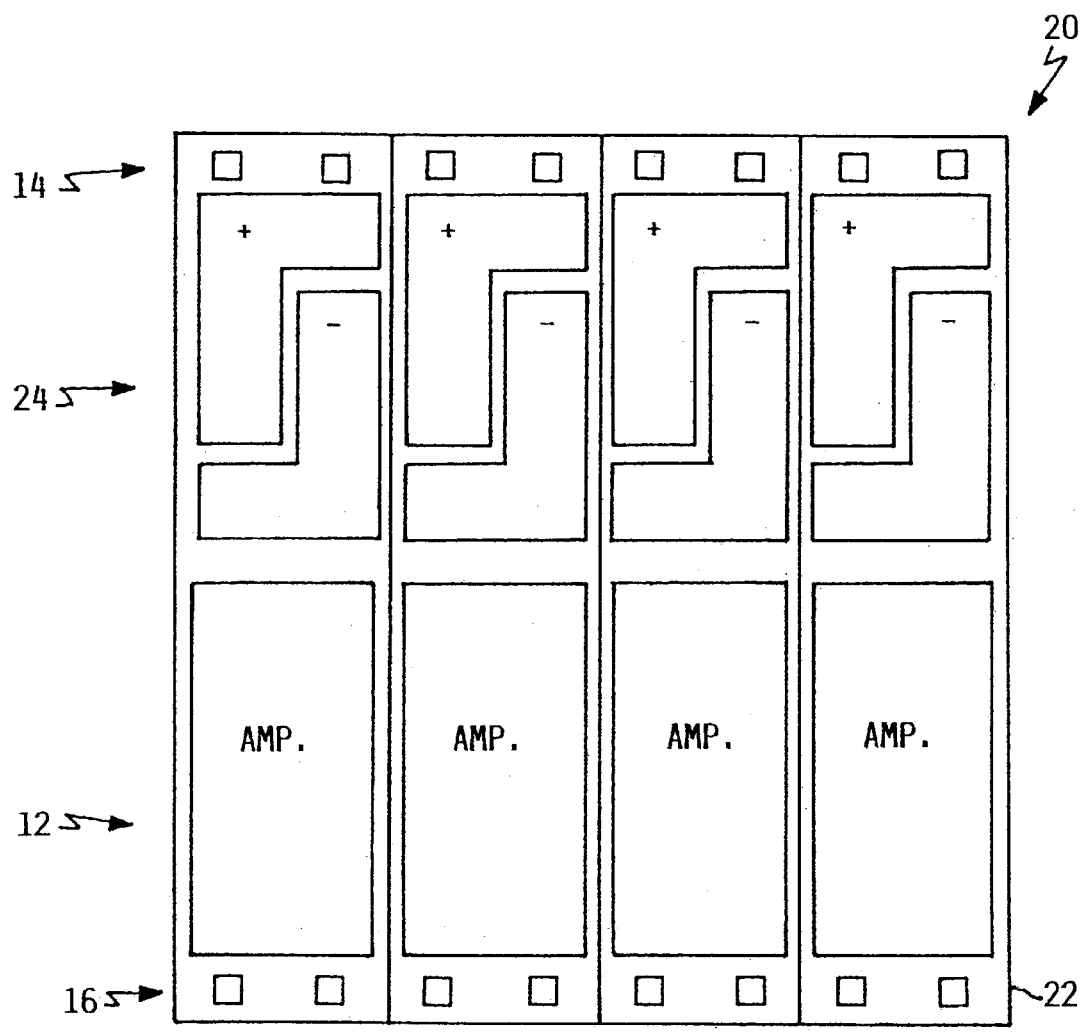
FIG. 2 is a schematic plan view of a multichannel IC amplifier provided in accordance with the present invention.

FIG. 2 is a schematic plan view of a four channel IC amplifier 20 provided in accordance with the present invention. The multichannel amplifier 20 includes a substrate 22 upon which the circuit elements are formed. The multichannel amplifier 20 may include the same amplifier circuits 12, input terminals 14, and output terminals 16 as in the conventional multichannel amplifier described with reference to FIG. 1. Each amplifier circuit 12 is coupled to its respective inputs 14 via a pair of DC-blocking capacitors 24. It will be observed that the capacitors 24 shown in FIG. 2 are configured in a different manner from the conventional DC-blocking capacitors 18 of FIG. 1. In particular, the capacitors 24 of the inventive multichannel IC amplifier of FIG. 2 are configured to provide cancellation of crosstalk signals.

Figure 2A:
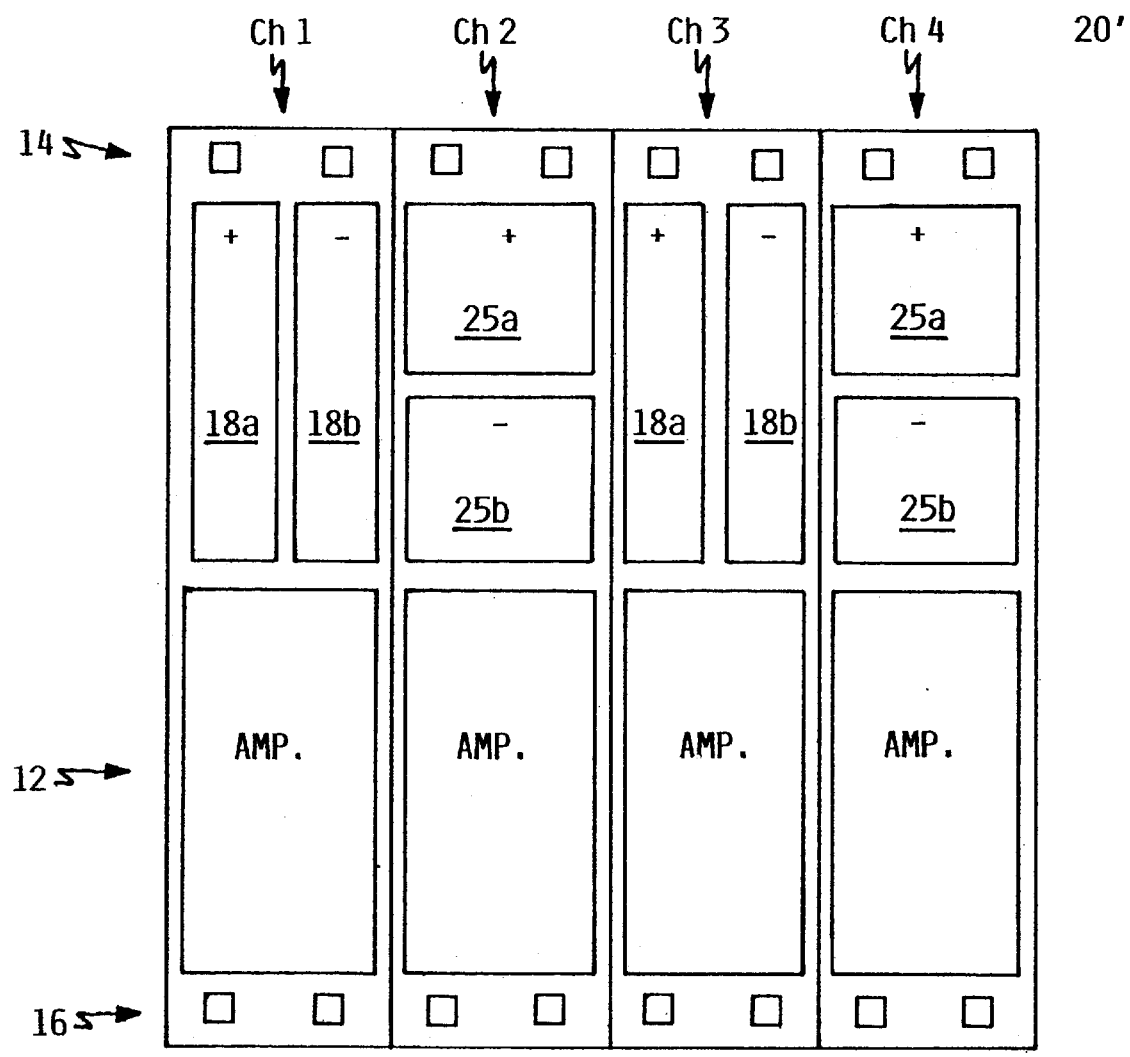
FIG. 2A is a schematic plan view of a multichannel IC amplifier provided in accordance with another embodiment of the invention.

As shown in FIG. 2, the capacitors 24 are all L-shaped, and the positive-sense capacitor and the negative-sense capacitor for each channel are nested to form a rectangle. The areas and perimeters of the L-shaped capacitors 24 of FIG. 2 may be substantially the same as the areas and perimeters of the rectangular capacitors of FIG. 1. The particular configuration shown in FIG. 2 is not essential, and a number of other configurations may also be employed, so long as like sense coupling (positive to positive and negative to negative coupling) between capacitors of adjacent channels is substantially equal to unlike sense coupling (negative to positive and positive to negative coupling) between capacitors of adjacent channels. Other exemplary capacitor configurations include the configuration illustrated in FIG. 2A. Again the multichannel IC amplifier shown in FIG. 2A may have the same amplifier circuits 12, input terminals 14 and output terminals 16 as in the conventional multichannel IC amplifier. In channels Ch1 and Ch3 the conventional rectangular capacitor configuration is provided, but in alternate channels Ch2 and Ch4 the DC-blocking capacitors 25*a* (positive-sense) and 25*b* (negative-sense) are substantially square and share edges of substantially equal length with the adjoining negative-sense capacitor 18*b* of the adjacent channel Ch1 or Ch3. Consequently, the like sense coupling and unlike sense coupling between adjacent channels is substantially equal.

It will be appreciated that each capacitor shown in FIG. 2 is represented by its top plate, and that a corresponding lower plate for each capacitor is also provided at a lower metal layer (not shown) on the substrate 22. Connecting traces (not shown) may be bridged through a still lower metal layer on the substrate. Preferably all of the capacitors shown in FIG. 2 are substantially equal in area and perimeter.

Figure 3:
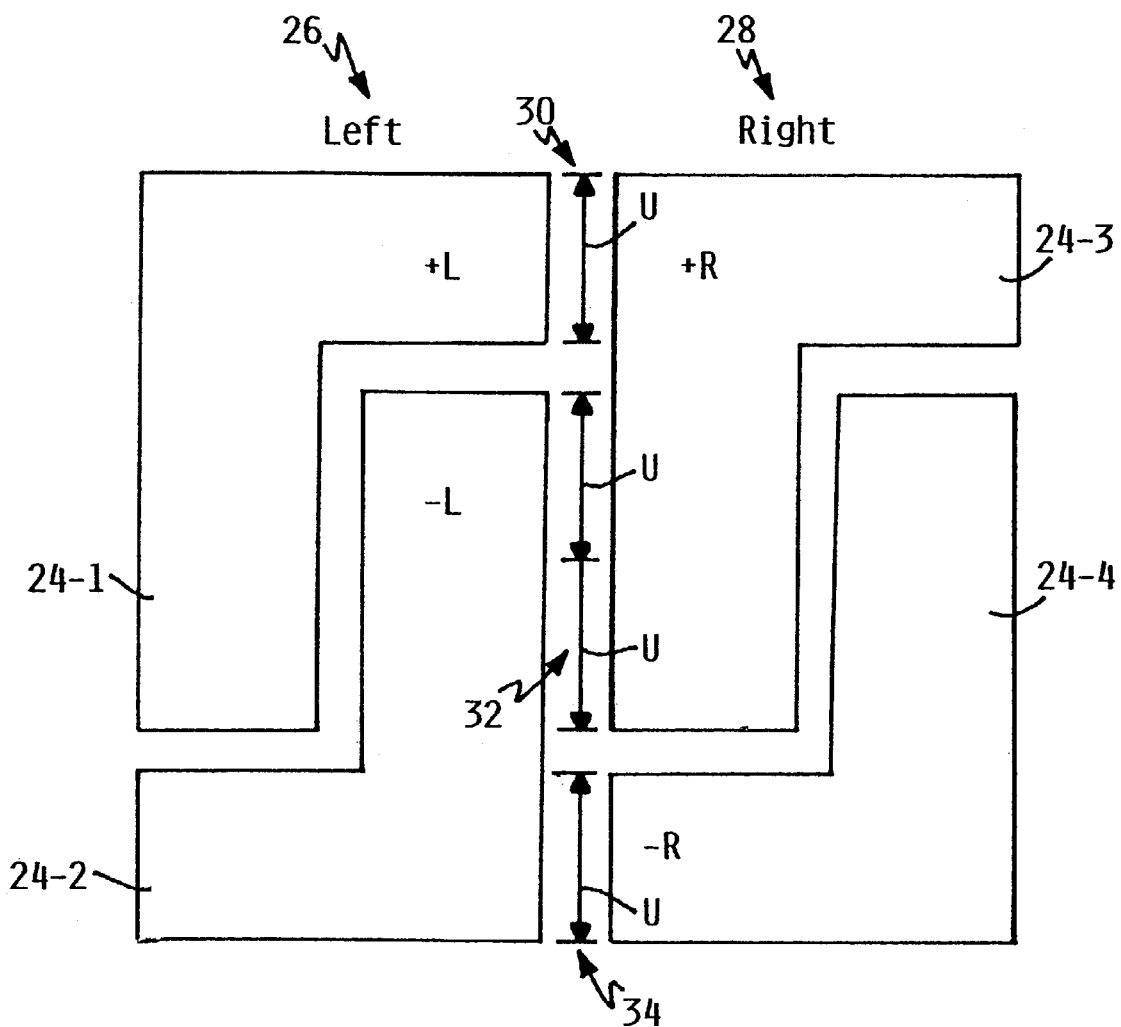
FIG. 3 is an enlarged plan view of capacitors for adjacent channels in the multichannel IC amplifier of FIG. 2.

FIG. 3 is an enlarged plan view showing the configuration of the capacitors in two adjacent channels of the embodiment of FIG. 2, including a left channel 26 and a right channel 28. The left channel 26 includes a positive-sense capacitor 24-1 and a negative-sense capacitor 24-2. The right channel 28 has a positive-sense capacitor 24-3 and a negative-sense capacitor 24-4. The coupling of signals from one channel to the other is substantially proportional to lengths of edge regions shared by the capacitors of the respective channels. The left-channel positive-sense capacitor 24-1 (+L) and the right-channel positive-sense capacitor 24-3 (+R) define therebetween a shared edge region 30 having a unit length U. The left-channel negative-sense capacitor 24-2 (−L) and the right-channel positive-sense capacitor 24-3 (+R) define therebetween a shared edge region 32 that has a length of twice the unit length or 2U. The left-channel negative-sense capacitor 24-2 and the right-channel negative-sense capacitor 24-4 (−R) define therebetween a shared edge region 34 which has a length U. Consequently, the −L to +R coupling is at twice the level of the +L to +R coupling. The levels of +L to +R and −L to −R coupling are substantially equal. The total like sense coupling (+L to +R and −L to −R) is substantially equal to the total unlike sense coupling (−L to +R; there is no substantial, if any, +L to −R coupling). The +L to +R coupling cancels substantially half of the −L to +R coupling, leaving a substantially equal amount of −L coupling to both +R and −R. Since the amplifiers 12 are differential amplifiers, the substantially equal signals coupled from −L to each of the right-channel capacitors appear as a common mode signal and are therefore rejected, leaving essentially no crosstalk apparent.

The present invention achieves substantial reduction or elimination of crosstalk as a result of a configuration of capacitors in adjacent channels to cancel signals coupled between channels. This solution to crosstalk is low cost and does not interfere with the overall design of the multichannel amplifier chip. It is contemplated to employ the crosstalk-canceling capacitor configuration of the present invention either alone, or in conjunction with other crosstalk-reduction techniques, such as isolation and/or shielding. The present invention may be applied, for example, in a multichannel preamp integrated detector for fiber optic communications, or in any other multichannel IC amplifier.

Methods for forming a multichannel IC amplifier such as that shown in FIGS. 2 and 3 are well known and are not described in detail herein. In general, however, the multichannel IC amplifier 20 may be formed via the steps of (1) providing a substrate, (2) forming a plurality of amplifier circuits on the substrate, each amplifier circuit defining a channel, (3) forming a pair of inputs for each amplifier circuit and (4) coupling each pair of inputs for each amplifier circuit to the amplifier circuit via a pair of capacitors configured so as to substantially equalize like sense and unlike sense coupling between adjacent channels.

The foregoing description discloses only the preferred embodiments of the invention; modifications of the above disclosed apparatus and method which fall within the scope of the invention will be readily apparent to those of ordinary skill in the art. For example, although in an exemplary embodiment disclosed above the capacitors were L-shaped, other shapes and configurations may be employed to provide equal like sense and unlike sense coupling between adjacent channels.

Accordingly, while the present invention has been disclosed in connection with a preferred embodiment thereof, it should be understood that other embodiments may fall within the spirit and scope of the invention, as defined by the following claims.

The invention claimed is:

1. A coplanar arrangement of four capacitor plates, each corresponding to a respective DC-blocking capacitor, the four plates respectively corresponding to a left-channel positive-sense capacitor, a left-channel negative-sense capacitor, a right-channel positive-sense capacitor and a right-channel negative-sense capacitor, the plate corresponding to the left-channel positive-sense capacitor and the plate corresponding to the right-channel positive-sense capacitor defining therebetween a first shared edge region having a length U, the plate corresponding to the left-channel negative-sense capacitor and the plate corresponding to the right-channel positive sense capacitor defining therebetween a second shared edge region having a length 2U, and the plate corresponding to the left-channel negative-sense capacitor and the plate corresponding to the right-channel negative-sense capacitor defining therebetween a third shared edge region having a length U.

2. The capacitor plate arrangement of claim 1, wherein the four capacitor plates are substantially equal in area.

3. The capacitor plate arrangement of claim 1, wherein the four capacitor plates are substantially equal in perimeter.

4. The capacitor plate arrangement of claim 1, wherein each of the capacitor plates is L-shaped.

5. The capacitor plate arrangement of claim 4, wherein the plate corresponding to the left-channel positive-sense capacitor and the plate corresponding to the left-channel negative-sense capacitor are nested together to form a first rectangle, and the plate corresponding to the right-channel positive-sense capacitor and the plate corresponding to the right-channel negative-sense capacitor are nested together to form a second rectangle adjacent the first rectangle.

\* \* \* \* \*